US009735761B2

(12) United States Patent
Sharpe-Geisler et al.

(10) Patent No.: US 9,735,761 B2
(45) Date of Patent: Aug. 15, 2017

(54) FLEXIBLE RIPPLE MODE DEVICE IMPLEMENTATION FOR PROGRAMMABLE LOGIC DEVICES (71) Applicant: Lattice Semiconductor Corporation, Hillsboro, OR (US)

(72) Inventors: Brad Sharpe-Geisler, San Jose, CA (US); Senani Gunaratna, Los Gatos, CA (US); Ting Yew, San Jose, CA (US)

(73) Assignee: LATTICE SEMICONDUCTOR CORPORATION, Hillsboro, OR (US)

( * ) Notice: Subject to any disclaimer, the term of this patent is extended or adjusted under 35 U.S.C. 154(b) by 0 days.

(21) Appl. No.: 14/610,074

(22) Filed: Jan. 30, 2015

(65) Prior Publication Data

US 2016/0028400 A1 Jan. 28, 2016

Related U.S. Application Data (60) Provisional application No. 62/028,441, filed on Jul. 24, 2014.

(51) Int. Cl.
*H03K 19/177* (2006.01)
*H03K 3/3562* (2006.01)
*H03K 19/00* (2006.01)
*H03K 19/173* (2006.01)
*G06F 17/50* (2006.01)
*H03K 3/356* (2006.01)

(52) U.S. Cl.
CPC ....... *H03K 3/35625* (2013.01); *G06F 17/505* (2013.01); *G06F 17/5054* (2013.01); *H03K 3/356156* (2013.01); *H03K 19/0016* (2013.01); *H03K 19/173* (2013.01); *H03K 19/17728* (2013.01)

(58) Field of Classification Search
None
See application file for complete search history.

(56) References Cited

U.S. PATENT DOCUMENTS 5,267,187 A * 11/1993 Hsieh ............ G06F 7/503
708/700
5,682,107 A * 10/1997 Tavana ............ H03K 19/17704
326/39
RE35,977 E  12/1998 Cliff et al.
6,367,059 B1 * 4/2002 Becker ............ G06F 7/503
716/118

(Continued)

Primary Examiner — Alexander H Taningco
Assistant Examiner — Nelson Correa
(74) Attorney, Agent, or Firm — Haynes and Boone, LLP (57) ABSTRACT Various techniques are provided to efficiently implement user designs in programmable logic devices (PLDs). In one example, a programmable logic device (PLD) includes a plurality of programmable logic blocks (PLBs) and a plurality of logic cells within at least one of the PLBs, where each logic cell includes a four input lookup table (4-LUT) configured to provide a 4-LUT output signal to associated carry logic. Each logic cell is configurable according to at least two selectable operational modes including a logic function output mode and a ripple arithmetic output mode, and at least three of the 4-LUT inputs are interchangeable when a selected operational mode comprises the ripple arithmetic output mode.

18 Claims, 7 Drawing Sheets (56) References Cited

U.S. PATENT DOCUMENTS

| | | | |
|---|---|---|---|
| 6,961,741 B2 * | 11/2005 | Swami | G06F 1/0356 |
| | | | 708/235 |
| 6,990,508 B1 * | 1/2006 | Mohammed | G06F 7/501 |
| | | | 708/700 |
| 7,028,281 B1 * | 4/2006 | Agrawal | G06F 17/5054 |
| | | | 326/41 |
| 7,061,268 B1 | 6/2006 | Lee et al. | |
| 7,268,584 B1 | 9/2007 | Cashman et al. | |
| 7,274,211 B1 | 9/2007 | Simkins et al. | |
| 7,466,163 B2 * | 12/2008 | Madurawe | H03K 19/17728 |
| | | | 326/38 |
| 7,565,387 B1 * | 7/2009 | Manohararajah | G06F 17/5054 |
| | | | 708/230 |
| 7,565,388 B1 | 7/2009 | Baeckler et al. | |
| 7,663,400 B1 * | 2/2010 | Plants | G06F 7/506 |
| | | | 326/38 |
| 7,880,499 B2 * | 2/2011 | Manohar | H03K 19/17728 |
| | | | 326/38 |
| 7,917,559 B2 * | 3/2011 | Redgrave | H03K 19/17748 |
| | | | 326/39 |
| 8,072,238 B1 * | 12/2011 | Hutton | H03K 19/17728 |
| | | | 326/38 |
| 8,482,312 B1 * | 7/2013 | Langhammer | H03K 19/17728 |
| | | | 326/38 |
| 8,521,801 B2 * | 8/2013 | Pistorius | G06F 7/508 |
| | | | 708/712 |

* cited by examiner

FLEXIBLE RIPPLE MODE DEVICE IMPLEMENTATION FOR PROGRAMMABLE LOGIC DEVICES

CROSS-REFERENCE TO RELATED APPLICATIONS

This patent application claims priority to and the benefit of U.S. Provisional Patent Application 62/028,441 filed Jul. 24, 2014 and entitled "RIPPLE MODE, SHARED LOGIC, AND COMBINING LUT OUTPUTS" which is hereby incorporated by reference in its entirety.

TECHNICAL FIELD

The present invention relates generally to programmable logic devices and, more particularly, to gate-level arrangements implemented in such devices.

BACKGROUND

Programmable logic devices (PLDs) (e.g., field programmable gate arrays (FPGAs), complex programmable logic devices (CPLDs), field programmable systems on a chip (FPSCs), or other types of programmable devices) may be configured with various user designs to implement desired functionality. Typically, the user designs are synthesized and mapped into configurable resources (e.g., programmable logic gates, look-up tables (LUTs), embedded hardware, or other types of resources) and interconnections available in particular PLDs. Physical placement and routing for the synthesized and mapped user designs may then be determined to generate configuration data for the particular PLDs.

Two primary types of configurable resources of a PLD include programmable logic blocks (PLBs) and routing resources. The logic blocks typically include a number of logic cells each containing a LUT and a register with some additional logic. The routing resources flexibly connect the logic blocks and/or cells to one another and can constitute greater than 65% of the area of the PLD, can consume most of the available power, and can take up most of a timing budget associated with a particular user design. In some cases, greater than 80% of the configuration bit cells (e.g., programmable memory) are used for routing. As such, routing limitations restrict PLB utilization. PLB utilization can be improved by increasing the amount of available routing resources, but such increases consume more area.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

In accordance with embodiments set forth herein, techniques are provided to efficiently implement user designs in programmable logic devices (PLDs). In various embodiments, a user design may be converted into and/or represented by a set of PLD components (e.g., configured for logic, arithmetic, or other hardware functions) and their associated interconnections available in a PLD.

For example, a PLD may include a number of programmable logic blocks (PLBs), each PLB including a number of logic cells, and configurable routing resources that may be used to interconnect the PLBs and/or logic cells. In some embodiments, each PLB may be implemented with between 2 and 16 or between 2 and 32 logic cells. In various embodiments, PLB utilization in a PLD can be improved by increasing the flexibility of the PLBs, logic cells, and/or routing resources to allow for additional degrees of freedom in the routing when implementing a particular user design. Such additional degrees of freedom may allow a larger number of PLBs to be serviced by a smaller selection of routing resources, as compared to conventional PLD implementations.

In accordance with embodiments described herein, one technique to improve PLB utilization is to exploit symmetry of the PLB itself through input interchange, which can significantly reduce the burden on routing resources by providing additional flexibility in where the interconnections can be made in the PLD.

The benefit can be understood as follows: a function of 4 variables, $F(w, x, y, z)=w^*/y+/w^*x^*z+/w$, in a user design may be assigned to a four input look up table (4-LUT) (e.g., after map, pack, and/or place). An initial assignment may be made where A=w, B=x, C=y, D=z, and A-D are input signals to the 4-LUT. In the course of routing the input signals to the 4-LUT, it may be recognized that it is more efficient, because of routing limitations and/or placement of the 4-LUT in the overall user design and/or in the corresponding PLD, to use the alternative assignment: A=z, B=x, C=y, and D=w. The function F may be transformed to accommodate the reassignment (e.g., interchange inputs A and D) and the configuration bits of the 4-LUT may be used to implement the transformation (e.g., the 4-LUT may be reprogrammed to implement the transformed function to account for interchanged inputs), as long as the inputs A and D are symmetric with respect to the logic cell implementing the function.

For improved performance and utilization in a PLD, it is common practice to construct logic cells with dedicated hardware to support frequently used functions. One example is hardware added to support ripple arithmetic output mode (e.g., "Ripple Mode"), where the logic cell is configured to calculate a sum or a function involving a sum. Ripple arithmetic output mode requires two outputs, a function or sum output, and a carry output. These two outputs cannot be mapped into a single LUT without extra logic because a conventional LUT is implemented with a single function output. Furthermore, if a carry output were to be implemented using a separate LUT, the resulting structure for a 32 bit carry-add would require 32 separate logic levels and be relatively slow. Thus, a hardened carry chain is a useful feature to implement in logic cells of a PLD. Conventional logic cell architectures have reduced the number of separate logic levels required to implement carry arithmetic, but they lack the routing flexibility provided by embodiments of the present disclosure.

According to embodiments disclosed herein, a multiple input LUT (e.g., a 4-LUT) implemented within a logic cell may be decomposed into a number of subcomponents selected to allow at least three inputs of the logic cell to be interchangeable when the operational mode of the logic cell is the ripple arithmetic output mode. The additional degrees of freedom provided by the three interchangeable inputs allows such embodiments to be routed with additional flexibility, which can significantly increase PLD utilization. Furthermore, the decompositions of the multiple input LUT disclosed herein are able to implement (e.g., in configurable resources of the LUT) almost all the same common functions as conventional designs, and are able to implement some functions that conventional designs are unable to implement. Thus, in addition to providing increased PLD utilization as a result of routing flexibility, embodiments may also increase PLD utilization by increasing the scope of functions that can be embedded in the corresponding LUT.

For example, in one embodiment, a 4-LUT may be decomposed into first and second 3-LUTS (e.g., both controlled by A, B, and C input signals) and a 2:1 output multiplexer controlled by a $4^{th}$ D input signal that selects between the two 3-LUTs. In ripple arithmetic output mode, the output of one 3-LUT may be used to provide a generate signal (GEN) and the output of the output multiplexer may be used to provide a propagate signal (PROP). These signals may in turn be used with a carry input signal (CIN) in downstream carry logic (e.g., as opposed to upstream carry logic that is typically situated at least partially between the inputs of the logic cell and the logic cell's LUT) that is configured to generate the two ripple arithmetic output signals function/sum (FSUM) and carry output (COUT).

As described more fully below, the disclosed logic cell structure allows three of the input signals (e.g., A, B, and C) to be interchangeable in ripple arithmetic output mode by changing the programming of the 4-LUT (e.g., the programming of the two 3-LUTs). Moreover, as noted herein, more logic and/or arithmetic functions can be implemented with this logic cell structure, thus providing increased overall functionality and general ability to embed multiple levels of upstream logic and/or arithmetic functions into a single logic cell or corresponding PLB or group of PLBs, which can help increase utilization and reduce propagation delay (e.g., through a reduced number of stages of operations). The increased routing flexibility and function embedding may be used when synthesizing, mapping, placing, and/or routing a user design into a corresponding reduced number of PLD components.

As a result of such process (e.g., optimization based on logic cell flexibility), a user design can be implemented relatively efficiently, thereby freeing up the configurable PLD components that would otherwise be occupied by additional arithmetic and/or logical operations and routing resources. Furthermore, because the number of stages of operations will typically be reduced, the propagation delay of the resulting user design will also be reduced, which in some cases may advantageously permit an increase in the clock frequency of a PLD configured with the user design. In some embodiments, the optimized user design may be represented by a netlist that identifies various types of components provided by the PLD and their associated signals. In embodiments that produce a netlist of the converted user design, the optimization process may be performed on such a netlist.

Figure 1:
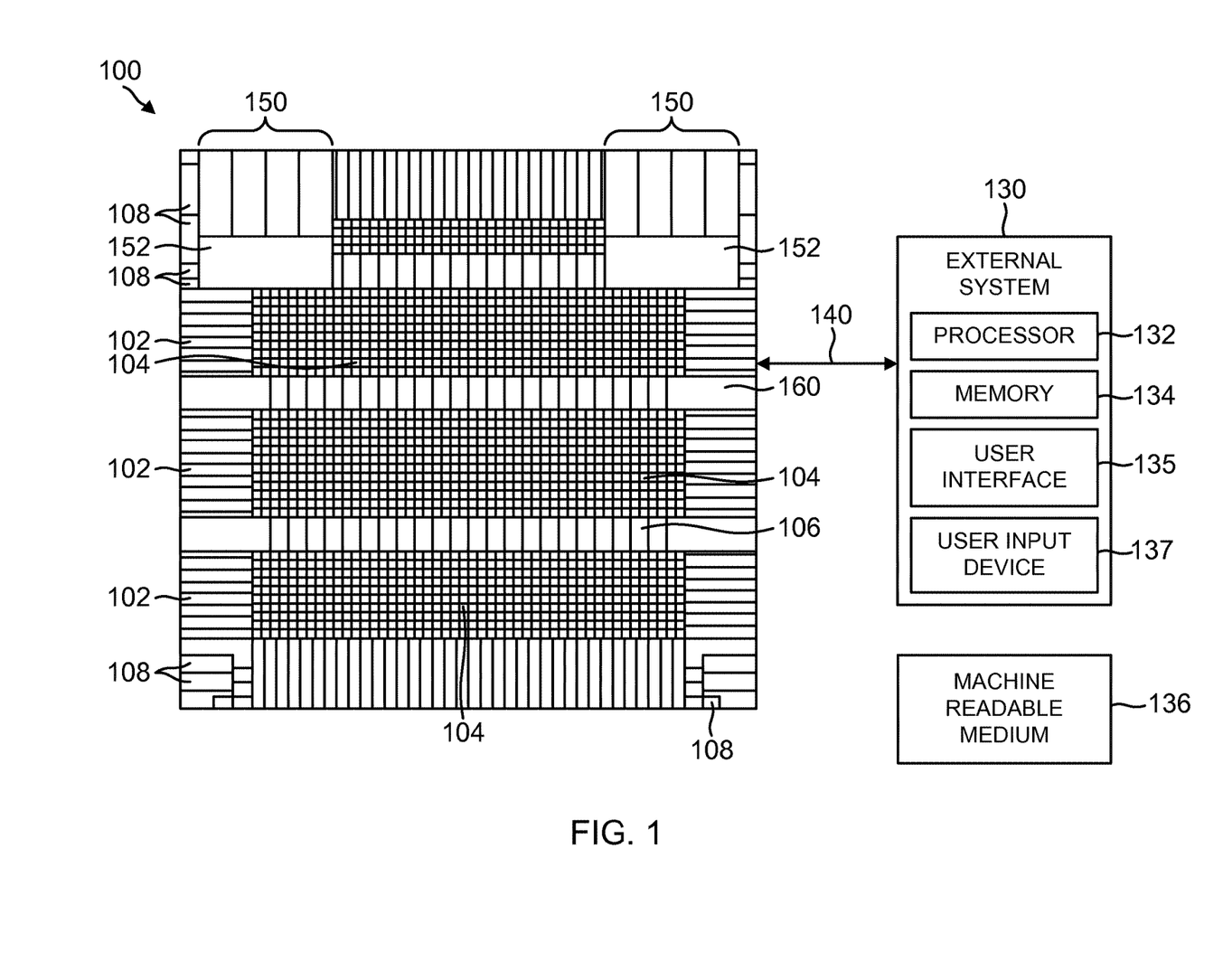
FIG. 1 illustrates a block diagram of a programmable logic device (PLD) in accordance with an embodiment of the disclosure.

Referring now to the drawings, FIG. 1 illustrates a block diagram of a PLD 100 in accordance with an embodiment of the disclosure. PLD 100 (e.g., a field programmable gate array (FPGA)), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)).

I/O blocks 102 provide I/O functionality (e.g., to support one or more I/O and/or memory interface standards) for PLD 100, while programmable logic blocks 104 provide logic functionality (e.g., LUT-based logic) for PLD 100. Additional I/O functionality may be provided by serializer/deserializer (SERDES) blocks 150 and physical coding sublayer (PCS) blocks 152. PLD 100 may also include hard intellectual property core (IP) blocks 160 to provide additional functionality (e.g., substantially predetermined functionality provided in hardware which may be configured with less programming than logic blocks 104).

PLD 100 may also include blocks of memory 106 (e.g., blocks of EEPROM, block SRAM, and/or flash memory), clock-related circuitry 108 (e.g., clock sources, PLL circuits, and/or DLL circuits), and/or various routing resources 180 (e.g., interconnect and appropriate switching logic to provide paths for routing signals throughout PLD 100, such as for clock signals, data signals, or others) as appropriate. In general, the various elements of PLD 100 may be used to perform their intended functions for desired applications, as would be understood by one skilled in the art.

For example, certain I/O blocks 102 may be used for programming memory 106 or transferring information (e.g., various types of user data and/or control signals) to/from PLD 100. Other I/O blocks 102 include a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). In various embodiments, I/O blocks 102 may be included to receive configuration data and commands (e.g., over one or more connections 140) to configure PLD 100 for its intended use and to support serial or parallel device configuration and information transfer with SERDES blocks 150, PCS blocks 152, hard IP blocks 160, and/or logic blocks 104 as appropriate.

It should be understood that the number and placement of the various elements are not limiting and may depend upon the desired application. For example, various elements may not be required for a desired application or design specification (e.g., for the type of programmable device selected).

Furthermore, it should be understood that the elements are illustrated in block form for clarity and that various elements would typically be distributed throughout PLD 100, such as in and between logic blocks 104, hard IP blocks 160, and routing resources (e.g., routing resources 180 of FIG. 2) to perform their conventional functions (e.g., storing configuration data that configures PLD 100 or providing interconnect structure within PLD 100). It should also be understood that the various embodiments disclosed herein are not limited to programmable logic devices, such as PLD 100, and may be applied to various other types of programmable devices, as would be understood by one skilled in the art.

An external system 130 may be used to create a desired user configuration or design of PLD 100 and generate corresponding configuration data to program (e.g., configure) PLD 100. For example, system 130 may provide such configuration data to one or more I/O blocks 102, SERDES blocks 150, and/or other portions of PLD 100. As a result, programmable logic blocks 104, various routing resources, and any other appropriate components of PLD 100 may be configured to operate in accordance with user-specified applications.

In the illustrated embodiment, system 130 is implemented as a computer system. In this regard, system 130 includes, for example, one or more processors 132 which may be configured to execute instructions, such as software instructions, provided in one or more memories 134 and/or stored in non-transitory form in one or more non-transitory machine readable mediums 136 (e.g., which may be internal or external to system 130). For example, in some embodiments, system 130 may run PLD configuration software, such as Lattice Diamond System Planner software available from Lattice Semiconductor Corporation to permit a user to create a desired configuration and generate corresponding configuration data to program PLD 100.

System 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of PLD 100.

Figure 2:
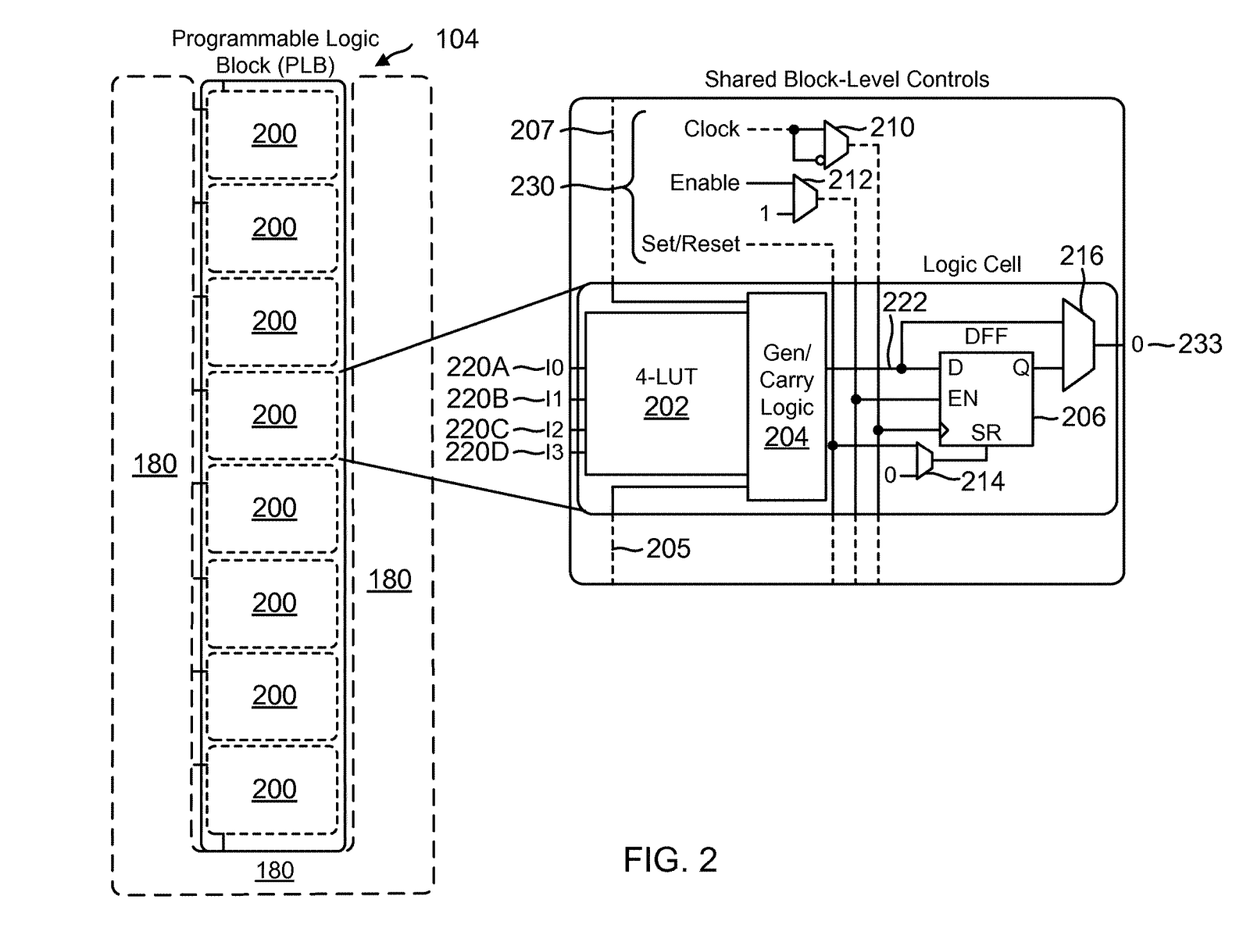
FIG. 2 illustrates a block diagram of a logic block for a PLD in accordance with an embodiment of the disclosure.

FIG. 2 illustrates a block diagram of a logic block 104 of PLD 100 in accordance with an embodiment of the disclosure. As discussed, PLD 100 includes a plurality of logic blocks 104 including various components to provide logic and arithmetic functionality.

In the example embodiment shown in FIG. 2, logic block 104 includes a plurality of logic cells 200, which may be interconnected internally within logic block 104 and/or externally using routing resources 180. For example, each logic cell 200 may include various components such as: a lookup table (LUT) 202, a generate/carry logic circuit 204, a latch 206 (e.g., register), and various programmable multiplexers (e.g., programmable multiplexers 212, 214, and 216) for selecting desired signal paths for logic cell 200 and/or between logic cells 200. In this example, LUT 202 accepts four inputs 220A-220D, which makes it a four-input LUT (which may be abbreviated as "4-LUT" or "LUT4") that can be programmed by configuration data for PLD 100 to implement any appropriate logic operation having four inputs or less. LUT 202 in other examples may be of any other suitable size having any other suitable number of inputs for a particular implementation of a PLD. In some embodiments, different size LUTs may be provided for different logic blocks 104 and/or different logic cells 200.

An output signal 222 from LUT 202 and/or generate/carry logic 204 may in some embodiments be passed through multiplexer 216 or register 206 to provide an output signal 233 of logic cell 200. Depending on the configuration of multiplexers 210-216, output signal 222 may be temporarily stored (e.g., latched) in latch 206 according to control signals 230. In some embodiments, configuration data for PLD 100 may configure output 233 of logic cell 200 to be provided as one or more inputs of another logic cell 200 (e.g., in another logic block or the same logic block) in a staged or cascaded arrangement (e.g., comprising multiple levels) to configure logic operations that cannot be implemented in a single logic cell 200 (e.g., logic operations that have too many inputs to be implemented by a single LUT 202).

Generate/carry logic circuit 204 may be utilized for some configurations of PLD 100 to efficiently implement arithmetic operations such as adders, subtractors, comparators, counters, or other operations, or to efficiently form some wide logic operations (e.g., working on multiple bit data). In this regard, generate/carry logic circuits 204 across multiple logic cells 202 may be chained together to pass carry-in signals 205 and carry-out signals 207 between adjacent logic cells 202. In the example of FIG. 2, carry-in signal 205 may be passed directly to generate/carry logic circuit 204, for example, or may be passed to generate/carry logic circuit 204 by configuring one or more programmable multiplexers. In some embodiments, generate/carry logic circuits 204 may be chained across multiple logic blocks 200. Generate/carry logic circuit 204 may be implemented to provide a carry value for arithmetic operations or logic operations. For example, in one embodiment, generate/carry logic circuit 204 may be implemented using a carry-multiplexer (also referred to as a "carry-mux"). More detailed embodiments are provided in FIGS. 4-6.

Logic cell 200 illustrated in FIG. 2 is merely an example, and logic cells 200 according to different embodiments may include different combinations and arrangements of PLD components. Also, although FIG. 2 illustrates logic block 104 having eight logic cells 200, logic block 104 according to other embodiments may include fewer logic cells 200 or more logic cells 200. Each of the logic cells 200 of logic block 104 may be used to implement a portion of a user design implemented by PLD 100. In this regard, PLD 100 may include many logic blocks 104, each of which may include logic cells 200 and/or other components which are used to collectively implement the user design.

As further described herein, portions of a user design may be adjusted to occupy fewer logic cells 200 and/or fewer logic blocks 104 when PLD 100 is configured to implement the user design. Such adjustments according to various embodiments may identify certain arithmetic or logic operations, such as ripple arithmetic operations, to be implemented in an arrangement occupying multiple embodiments of logic cells 200 and/or logic blocks 104. As further described herein, an optimization process may rearrange various signal connections associated with the arithmetic/logic operations described herein, such that a ripple arithmetic operation may be implemented into logic cells 200 and/or logic blocks 104 to be associated with the preceding arithmetic/logic operations.

Figure 3:
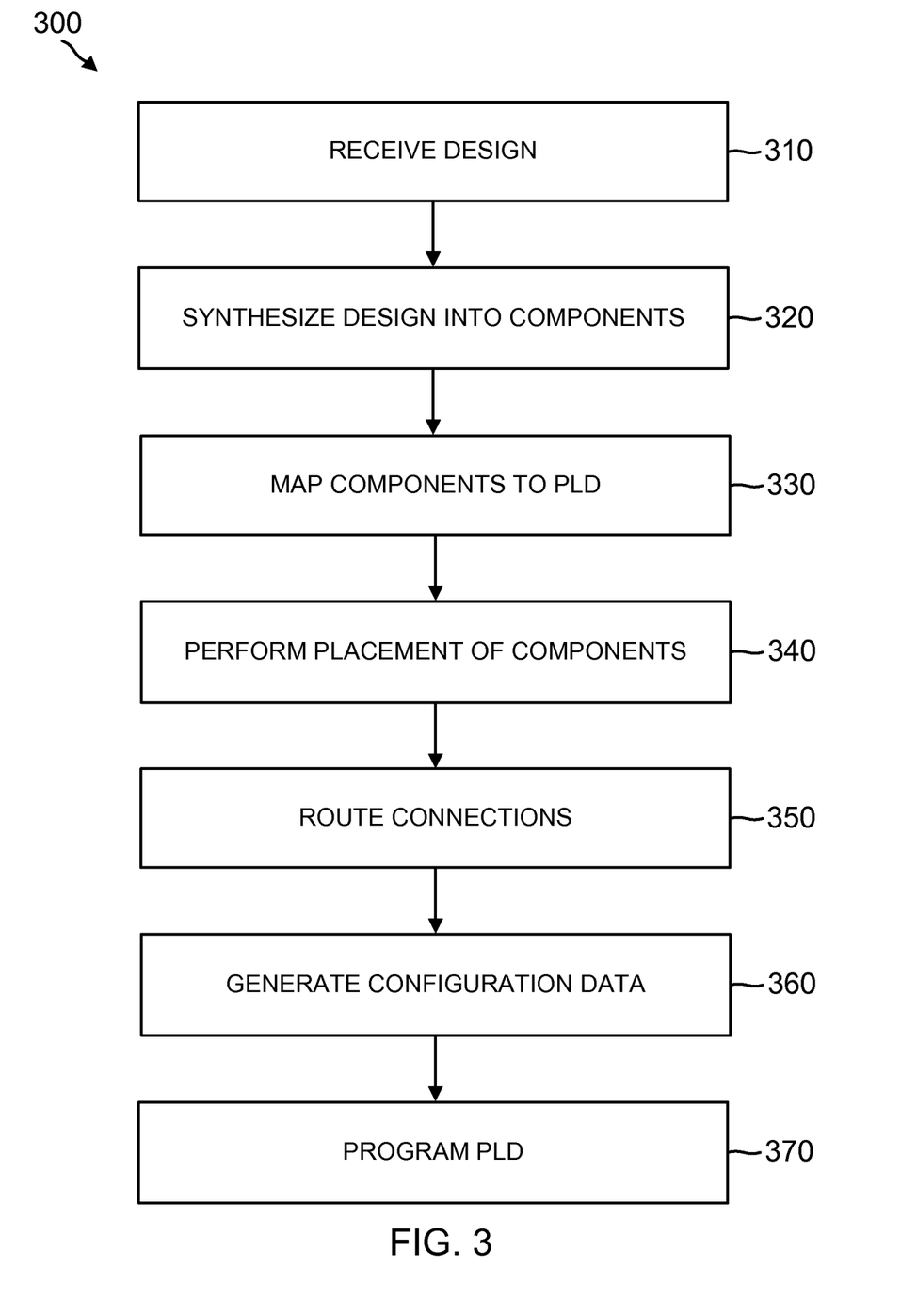
FIG. 3 illustrates a design process for a PLD in accordance with an embodiment of the disclosure.

FIG. 3 illustrates a design process 300 for a PLD in accordance with an embodiment of the disclosure. For example, the process of FIG. 3 may be performed by system 130 running Lattice Diamond software to configure PLD 100. In some embodiments, the various files and information referenced in FIG. 3 may be stored, for example, in one or more databases and/or other data structures in memory 134, machine readable medium 136, and/or otherwise.

In operation 310, system 130 receives a user design that specifies the desired functionality of PLD 100. For example, the user may interact with system 130 (e.g., through user input device 137 and hardware description language (HDL) code representing the design) to identify various features of the user design (e.g., high level logic operations, hardware configurations, and/or other features). In some embodiments, the user design may be provided in a register transfer level (RTL) description (e.g., a gate level description). System 130 may perform one or more rule checks to confirm that the user design describes a valid configuration of PLD 100. For example, system 130 may reject invalid configurations and/or request the user to provide new design information as appropriate.

In operation 320, system 130 synthesizes the design to create a netlist (e.g., a synthesized RTL description) identifying an abstract logic implementation of the user design as a plurality of logic components (e.g., also referred to as netlist components). In some embodiments, the netlist may be stored in Electronic Design Interchange Format (EDIF) in a Native Generic Database (NGD) file.

In some embodiments, synthesizing the design into a netlist in operation 320 may involve converting (e.g., translating) the high-level description of logic operations, hardware configurations, and/or other features in the user design into a set of PLD components (e.g., logic blocks 104, logic cells 200, and other components of PLD 100 configured for logic, arithmetic, or other hardware functions to implement the user design) and their associated interconnections or signals. Depending on embodiments, the converted user design may be represented as a netlist.

In some embodiments, synthesizing the design into a netlist in operation 320 may further involve performing an optimization process on the user design (e.g., the user design converted/translated into a set of PLD components and their associated interconnections or signals) to reduce propagation delays, consumption of PLD resources and routing resources, and/or otherwise optimize the performance of the PLD when configured to implement the user design. Depending on embodiments, the optimization process may be performed on a netlist representing the converted/translated user design. Depending on embodiments, the optimization process may represent the optimized user design in a netlist (e.g., to produce an optimized netlist).

In some embodiments, the optimization process may include optimizing certain instances of a ripple arithmetic operation which, when a PLD is configured to implement the user design, would occupy a plurality of configurable PLD components (e.g., logic cells 200, logic blocks 104, and/or routing resources 180). For example, the optimization process may include detecting ripple arithmetic operations and/or corresponding routing resources in the user design, implementing the arithmetic operations into logic cells with at least three interchangeable inputs, interchanging two or more of the at least three inputs of the logic cells implementing the ripple arithmetic operations to reduce the number of PLD components used to implement the ripple arithmetic operations and/or routing resources and/or to reduce the propagation delay associated with the ripple arithmetic operations, and/or reprogramming a corresponding LUT to transform the ripple arithmetic operation to account for the interchanged inputs.

In operation 330, system 130 performs a mapping process that identifies components of PLD 100 that may be used to implement the user design. In this regard, system 130 may map the optimized netlist (e.g., stored in operation 320 as a result of the optimization process) to various types of components provided by PLD 100 (e.g., logic blocks 104, logic cells 200, embedded hardware, and/or other portions of PLD 100) and their associated signals (e.g., in a logical fashion, but without yet specifying placement or routing). In some embodiments, the mapping may be performed on one or more previously-stored NGD files, with the mapping results stored as a physical design file (e.g., also referred to as an NCD file). In some embodiments, the mapping process may be performed as part of the synthesis process in operation 320 to produce a netlist that is mapped to PLD components.

In operation 340, system 130 performs a placement process to assign the mapped netlist components to particular physical components residing at specific physical locations of the PLD 100 (e.g., assigned to particular logic cells 200, logic blocks 104, routing resources 180, and/or other physical components of PLD 100), and thus determine a layout for the PLD 100. In some embodiments, the placement may be performed on one or more previously-stored NCD files, with the placement results stored as another physical design file.

In operation 350, system 130 performs a routing process to route connections (e.g., using routing resources 180) among the components of PLD 100 based on the placement layout determined in operation 340 to realize the physical interconnections among the placed components. In some embodiments, the routing may be performed on one or more previously-stored NCD files, with the routing results stored as another physical design file.

In various embodiments, routing the connections in operation 350 may further involve performing an optimization process on the user design to reduce propagation delays, consumption of PLD resources and/or routing resources, and/or otherwise optimize the performance of the PLD when configured to implement the user design. The optimization process may in some embodiments be performed on a physical design file representing the converted/translated user design, and the optimization process may represent the optimized user design in the physical design file (e.g., to produce an optimized physical design file).

In some embodiments, the optimization process may include optimizing certain instances of a ripple arithmetic operation which, when a PLD is configured to implement the user design, would occupy a plurality of configurable PLD components (e.g., logic cells 200, logic blocks 104, and/or routing resources 180). For example, the optimization process may include detecting logic cells with at least three interchangeable inputs implementing ripple arithmetic operations and/or corresponding routing resources in the user design, interchanging two or more of the at least three interchangeable inputs of the logic cells implementing the ripple arithmetic operations to reduce the number of PLD components used to implement the ripple arithmetic operations and/or routing resources and/or to reduce the propagation delay associated with the ripple arithmetic operations, and/or reprogramming a corresponding LUT to transform the ripple arithmetic operation to account for the interchanged inputs. Changes in the routing may be propagated back to prior operations, such as synthesis, mapping, and/or placement, to further optimize various aspects of the user design.

Thus, following operation 350, one or more physical design files may be provided which specify the user design after it has been synthesized (e.g., converted and optimized), mapped, placed, and routed (e.g., further optimized) for PLD 100 (e.g., by combining the results of the corresponding previous operations). In operation 360, system 130 generates configuration data for the synthesized, mapped, placed, and routed user design. In operation 370, system 130 configures PLD 100 with the configuration data by, for example, loading a configuration data bitstream into PLD 100 over connection 140.

Figure 4:
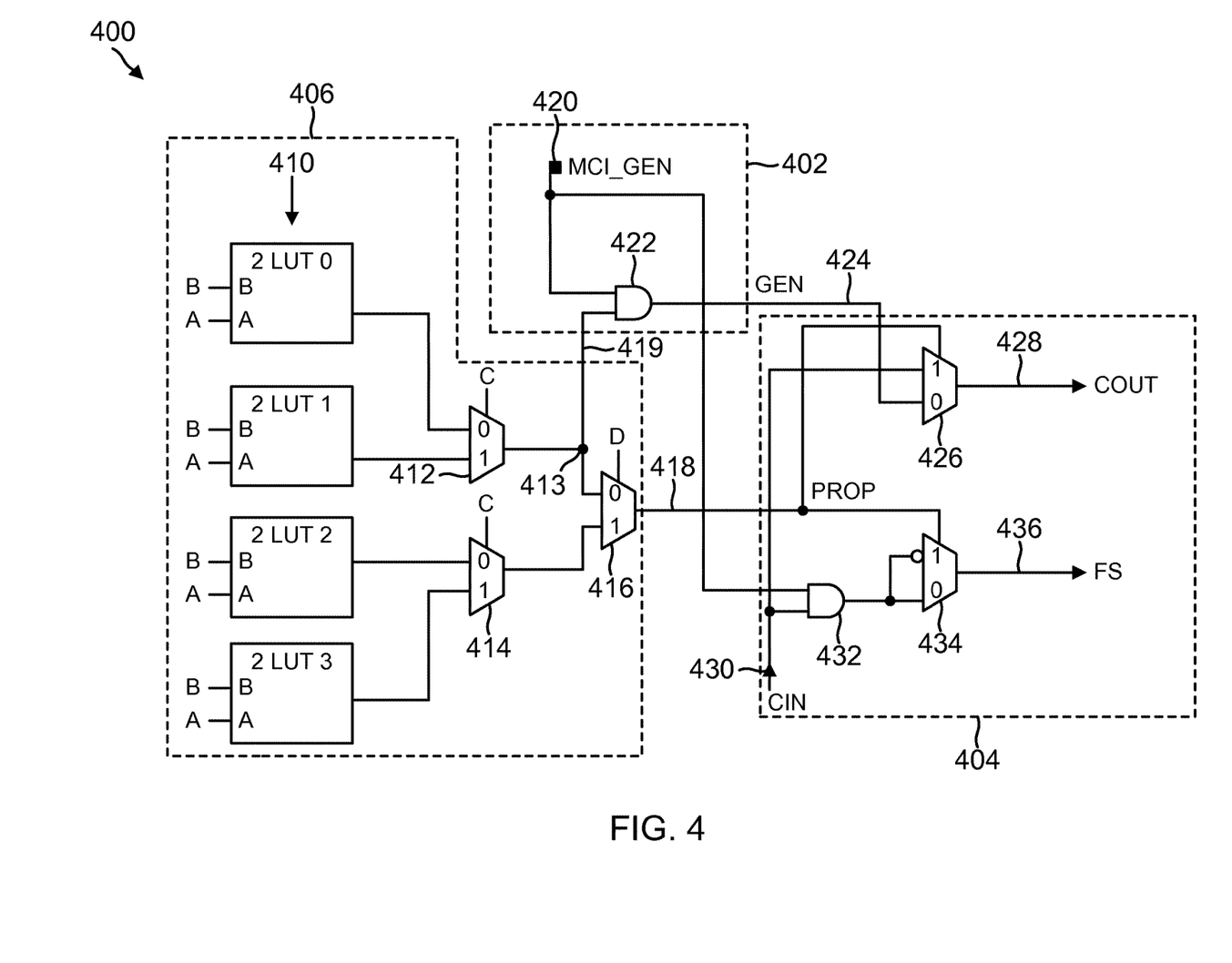
FIG. 4 illustrates a block diagram of a look up table (LUT) and carry logic for a logic cell for a PLD in accordance with an embodiment of the disclosure.

FIG. 4 illustrates a block diagram of a logic cell 400 in accordance with an embodiment of the disclosure. Logic cell 400 generally includes at least one LUT 406 used to provide a programmable output signal 418 (e.g., also sometimes referred to as a "propagate" signal) according to multiple input signals (e.g., as shown in FIG. 4, four input signals A, B, C, and D, thereby making the LUT a four input LUT or 4-LUT), generate circuitry 402, and carry logic 404 used to provide output signals 428 and/or 436. In the embodiment shown in FIG. 4, the LUT 406 of logic cell 400 is implemented using four substantially parallel two-input LUTS (2-LUTs) 410 feeding into two substantially parallel midlevel multiplexers 412 and 414, which themselves feed into output multiplexor 416 that generates 4-LUT output signal 418. As such, 4-LUT 406 may be decomposed into two 3-LUTs: a first 3-LUT including midlevel multiplexer 412 and corresponding coupled two of 2-LUTS 410 and a second 3-LUT including midlevel multiplexer 414 and corresponding coupled two of 2-LUTS 410.

In some embodiments, each of multiplexers 412-416 may be implemented as programmable multiplexors similar to multiplexors 210-216 of FIG. 2. Other implementations of a LUT for logic cell 400 are contemplated (e.g., a 5-LUT, a 6-LUT, and/or higher input LUTs), for example, and the systems and methods described herein may be extended to cover such implementations. In various embodiments, logic cell 400 may be implemented with a latch or register coupled to output signals 428 and/or 436 to store and/or buffer such outputs, similarly as described with reference to latch 206 of FIG. 2.

Also shown in FIG. 4 is node 413 of 4-LUT 406 disposed between midlevel multiplexor 412 and output multiplexor 416 and configured to provide tap signal 419 of 4-LUT 406 to generate circuitry 402. As described herein, and as shown in FIG. 4, tap signal 419 depends on three (e.g., A, B, C) of the four input signals (A, B, C, D) for logic cell 400, and so the three input signals for tap signal 419 are interchangeable (e.g., regardless of an operational mode selected for logic cell 400). For example, generate circuitry 402 may include generate register 420 configured to enable/disable generate signal 424, which depends on the combination of tap signal 419 and the value of register 420 (e.g. combined by "AND" logic element 422) and is provided to carry logic 404. As such, generate circuitry 402 may be configured to provide generate signal 424 to carry logic 404. In some embodiments, generate register 420 may be routed directly to carry logic 404 to enable/disable a carry input signal ("CIN") 430 (e.g., through use of "AND" logic element 432 as shown), which in some embodiments may be provided by another logic cell similar to logic cell 400.

Carry logic 404 may be configured to receive generate signal 424, a value of register 420 and/or other registers as described herein, and/or LUT output signal 418, and provide output signals 428 and/or 436. For example, the presence and/or content of output signals 428 and/or 436 may depend on a selected operational mode of logic cell 400. In the embodiment shown, carry logic 404 is configured to provide either a function ("F") or sum ("S") output signal 436 depending on 4-LUT output signal 418 and the combination of the value of register 420 and carry input signal 430 (e.g., combined by logic element 432) as multiplexed by multiplexer 434, and carry logic 404 is configured to provide a carry output signal ("COUT") 428 that depends on 4-LUT output signal 418, generate signal 424, and carry input signal 430 as multiplexed by multiplexer 434. In various embodiments, carry logic 404 and generate circuitry 402 may be combined into a single block (e.g., similar to generate/carry logic 204 of FIG. 2), and other arrangements for carry logic 404 and/or generate circuitry 402 are contemplated, such as the embodiments described in relation to FIGS. 5 and 6.

Figure 5:
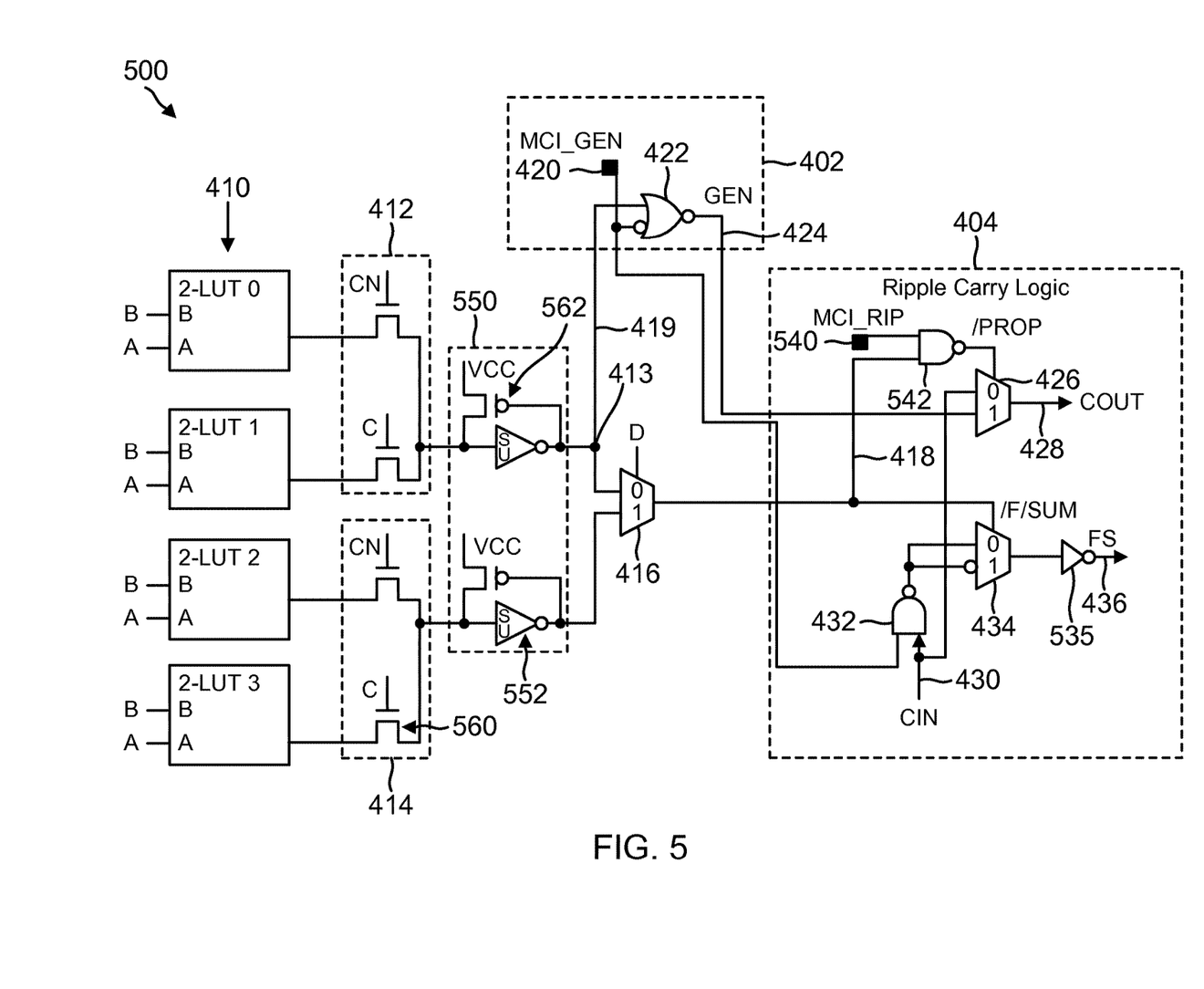
FIG. 5 illustrates a block diagram of a LUT and carry logic for a logic cell for a PLD in accordance with an embodiment of the disclosure.

FIG. 5 illustrates a block diagram of a logic cell for a PLD in accordance with an embodiment of the disclosure. In some embodiments, logic cell 500 may be similar to logic cell 400 of FIG. 4 but provide more specific and/or different implementations of various portions of a logic cell, as described herein. For example, LUT 406 (dashed line omitted in FIG. 5 for clarity), which includes 2-LUTs 410, midlevel multiplexers 412 and 414, output multiplexer 416, and various interconnections, may in some embodiments include level restoring stage 550. Level restoring stage 550 may be configured to receive multiplexed output signals from midlevel multiplexers 412 and/or 414 (e.g., output signals that may have degraded or off-nominal voltage levels, for example) and restore the degraded voltage levels to substantially the correct voltage levels corresponding to logic "on" or "1" (e.g., system voltage Vcc) and/or "off" or "0" (e.g., zero voltage) for logic cell 500. As such, level restoring stage 550 may be configured to provide restored multiplexed signals to output multiplexer 416.

In some embodiments, level restoring stage 550 may include one or more feedback loops including an inverter 552 with its output coupled to the gate of a P-type metal oxide semiconductor (PMOS) transistor/transistor structure 562 that is itself coupled (e.g., source and drain) between a system voltage Vcc and the input for inverter 552. As such, one of inverters 552 may be configured to provide tap signal 419, as shown. In some embodiments, inverter 552 may be implemented with one or more low or ultra-low threshold voltage transistor structures or arrangements (e.g., implemented with one or more N or P type MOS (NMOS or PMOS) transistors configured to have low and/or ultra-low threshold voltages, relative to the nominal system voltage Vcc and/or other transistor structures within logic cell 500).

Level restoring stage 550 may be particularly helpful when midlevel multiplexers 412 and 414 are implemented with NMOS pass gates (e.g., using one or more NMOS transistors 560), which must pass both a high and a low logic level, and which typically pass a high logic level with a degraded voltage. As shown, midlevel multiplexers 412 and/or 414 may be implemented compactly using a pair of pass gates coupled to input C and its complement, indicated in FIG. 5 as CN, which may be generated through use of one or more logic elements, such as an inverter (e.g., similar to logic element 517).

In the embodiment shown in FIG. 5, carry logic 404 includes ripple register 540 configured to enable/disable pass through of 4-LUT output/propagate signal 418 (e.g., or its complement labeled "/PROP" in FIG. 5) to multiplexer 426, as shown. In some embodiments, the presence and/or content of carry output signal 428 may depend on a selected operational mode of logic cell 500, such as a ripple arithmetic output mode where the value of ripple register 540 and generate register 420 are both logic high. In such operational mode, carry output signal 428 may correspond to the carry output of a ripple arithmetic function embedded into the LUT of logic cell 500 (e.g., including 2-LUTS 410, midlevel multiplexers 412 and 414, and output multiplexer 416, along with various interconnections and/or logic elements, such as NAND 542), generate signal 424, and/or carry input 430, as shown. Moreover, in such operational mode, functional/sum output signal 436 may correspond to a ripple arithmetic function output 418 of the corresponding LUT (e.g., provided in FIG. 5 by output multiplexer 416) that may depend on LUT output signal 418 and the value of generate register 420 combined (e.g. using NAND logic element 432) with carry input 430.

In one embodiment, the LUT of logic cell 500 (e.g., corresponding roughly to LUT 406 of FIG. 4), when in ripple arithmetic output mode, may be configured to implement a one bit arithmetic sum with carry input and output functionality. In other embodiments, logic cell 500, when in ripple arithmetic output mode, may be configured to implement a number of arithmetic functions (multiplies, divides, sums, differences, and/or other arithmetic functions and/or combinations of functions) embedded into its corresponding LUT with carry input and output functionality. In further embodiments, logic cell 500, when not in ripple arithmetic output mode (e.g., where generate register 420 has a value of zero and ripple register 540 has a value of one), may be configured to implement other logic functions and/or arithmetic functions. In such embodiments, output signal 428 may correspond to a wide logic function output (e.g., such as a wide AND or NOR or multiplexor logic function implemented across a number of logic cells providing inputs into the wide logic function). In some embodiments, where both generate register 420 and ripple register 540 have a value of zero, logic cell 500 may be considered to be in logic function output mode, where output signal 436 corresponds to 4-LUT output signal 418.

As shown in FIG. 5, in some embodiments, combinatorial logic element 422 of generate circuitry 402 may be implemented with a NOR combinatorial logic element to provide generate signal 424, as opposed to an AND combinatorial logic element as shown in FIG. 4, to compensate for the signal inversion provided by the illustrated level restoring stage 550. Other logic elements, such as inverter 535, NAND logic elements 432 and 542, and/or multiplexers 426 and 434 may be provided and/or implemented to provide an expected output polarity or correspondence for output signals 428 and/or 436, as shown.

In the embodiment shown in FIG. 5, node 413 of the LUT implementation for logic cell 500 is configured to provide tap signal 419 after it has been restored by level restoring stage 550. As such, in addition to three inputs of logic cell 500 being interchangeable, generate circuitry 402 does not require its own level restoring circuitry to ensure a stable generate signal 424. This allows embodiments of logic cell 500 to be significantly reduced in size as compared to alternative logic cells where an input signal for generate circuitry 402 is provided from separate circuitry or a direct output of a 2-LUT or a midlevel multiplexer, for example. Furthermore, through use of a low or ultra-low threshold voltage inverters 552, embodiments of logic cell 500 including level restoring stage 550 and corresponding compact generate circuitry 402 (e.g., comprising a single logic element 422 and/or one or more additional relatively simple logic elements) may be configured to operate at relatively high clock speeds due to the reduced threshold voltage operation of inverter 552 and more easily synchronized operation of compact generate circuitry 402. Moreover, various embodiments of logic cell 500 including level restoring stage 550 and compact generate circuitry 402 may be configured for relatively low power usage (e.g., compared to alternative implementations) by implementing the feedback of inverter 552 with various PMOS transistors 562 as shown in FIG. 5 and/or FIG. 6.

Figure 6:
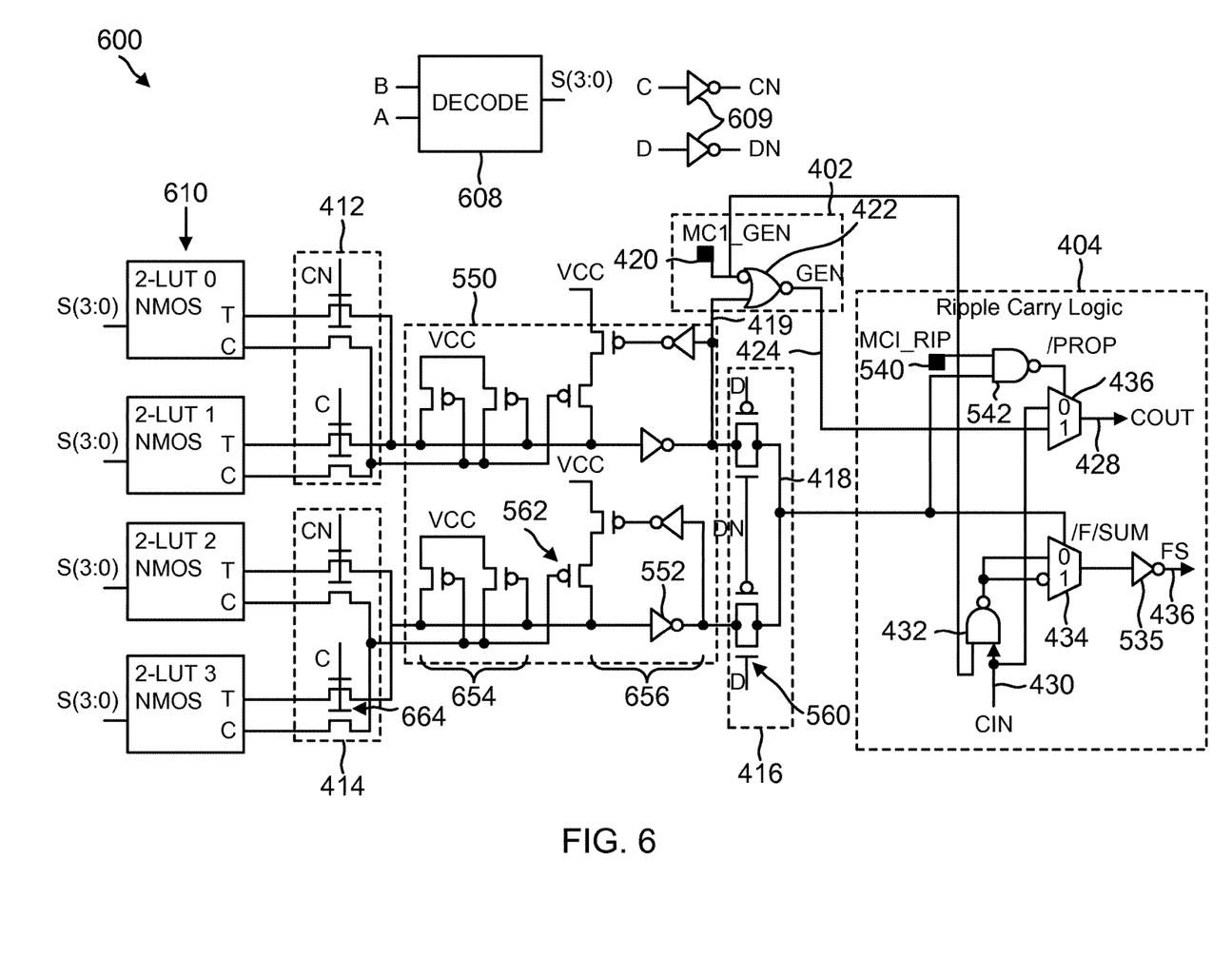
FIG. 6 illustrates a block diagram of a LUT and carry logic for a logic cell for a PLD implemented in complementary circuitry in accordance with an embodiment of the disclosure.

FIG. 6 illustrates a block diagram of logic cell 600 for a PLD implemented in complementary circuitry in accordance with an embodiment of the disclosure. In some embodiments, logic cell 600 may roughly correspond to logic cell 500 in FIG. 5, for example, but with one or more portions implemented in complementary circuitry as shown, which may allow logic cell 600 to operate at lower system voltages Vcc and/or with devices with higher threshold voltages (e.g., which can help reduce power loss due to leakage currents through, for example, transistor structures).

Figure 7:
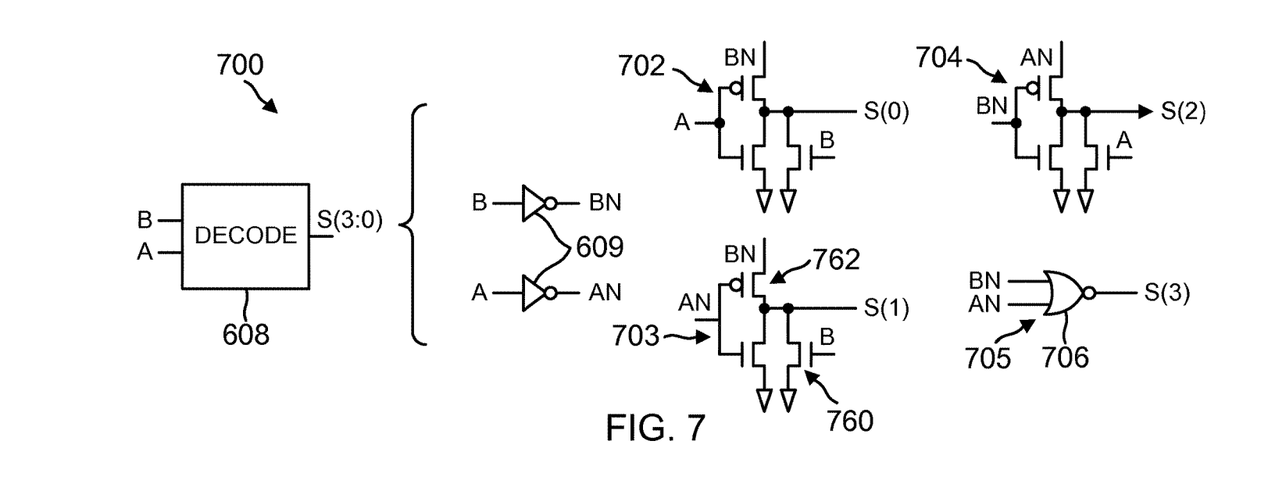
FIGS. 7-8 illustrate block diagrams of logic functions and circuitry for a 2-LUT implemented in complementary circuitry in accordance with an embodiment of the disclosure.
Figure 8:
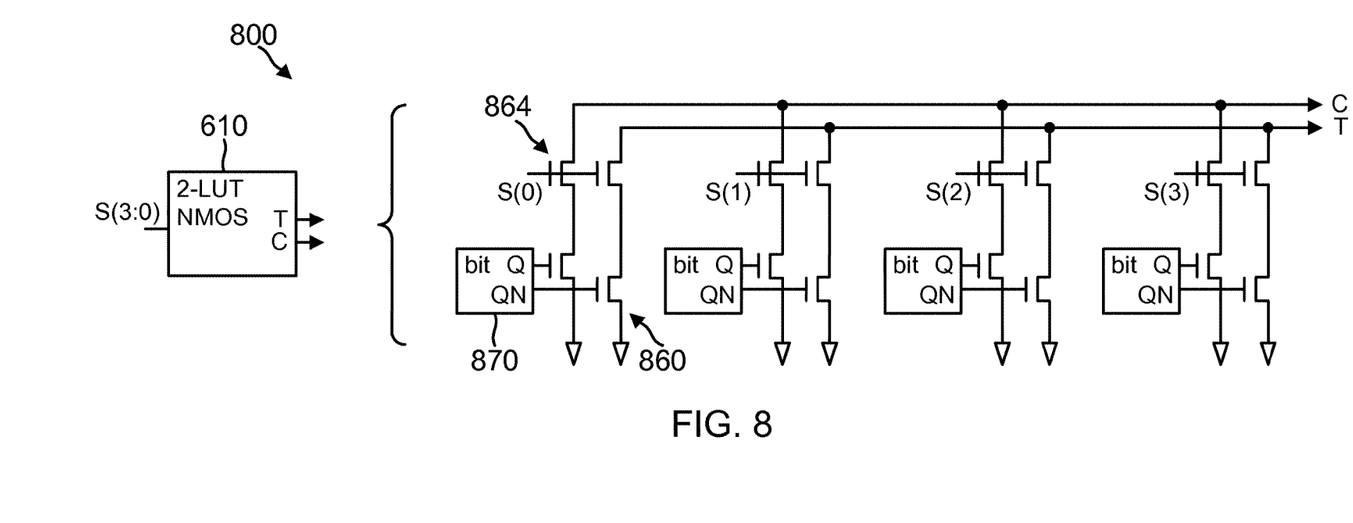

For example, midlevel multiplexers 412 and 414 in FIG. 6 are shown implemented with gate coupled NMOS transistor structures/pass gates 664 coupled to true "T" and complement "C" differential outputs of NMOS 2-LUTs 610 that are configured to receive quaternary decode signal S(3:0) provided by decode block 608 (decode block 608 and NMOS 2-LUTs 610 are described further in FIGS. 7-8). Each gate coupled NMOS transistors/pass gates 664 of midlevel multiplexers 412 and 414 need only reliably pass a logic low because the corresponding logic high will be restored by level restoring stage 550, and so each can be implemented with a relatively high threshold voltage (e.g., as compared to logic cell 500) and the resulting leakage current losses are relatively small. As such, logic cell 600 may be operated at relatively low system voltages Vcc yet still be operated at relatively high clock speeds, in part due to cross coupled PMOS transistor arrangement 654 and feedback structure 656, which operate together to ensure proper signal voltage levels and relatively fast switching performance.

For example, in some embodiments, cross coupled PMOS transistor arrangement 654 may be configured to restore proper/system signal voltage levels and to convert the differential signals provided by multiplexers 412 and 414 to a single ended signal, which is provided to inverter 552 (e.g., which may in some embodiments be implemented with a low or ultra-low threshold voltage inverter). In such embodiments, feedback structure 656 (e.g., including inverter 552, another inverter, and two PMOS transistor structures coupled between Vcc and the input for inverter 552, as shown) may be configured to provide relatively high speed performance in transitions in the single ended signal, such as low to high transitions, for example. In embodiments with level restoring stage 550 as shown in FIG. 6, output multiplexer 416 may be implemented in complementary MOS (CMOS) to control output/propagate signal 418 as shown. Inputs "C" and "D" may be used to provide their respective complements "CN" and "DN" using inverters 609 as shown. Due to the specific implementation of decode block 608, NMOS 2-LUTs 610, midlevel multiplexers 412 and 414, and level restoring stage 550, generate circuitry 402 may be configured to read generate register 420 in complement form, which may be provided as a separate register and/or through use of an inverter (e.g., similar to inverters 609).

FIGS. 7-8 illustrate block diagrams of logic functions and circuitry for a 2-LUT (e.g., decode block 608 and NMOS 2-LUT 610) implemented in complementary circuitry in accordance with an embodiment of the disclosure. For example, inputs A and B may be provided to decode block 608, which may be configured to provide quaternary decode signal S(3:0) to NMOS 2-LUTs 610 described in detail in FIG. 8. In some embodiments, decode block 608 may be configured to generate decode signal S(3:0) according to circuit segments 702, 703, 704, and 706, including various NMOS transistor structures 760, PMOS transistor structures 762, logic elements (e.g., NOR logic element 706, inverters 609, and/or other logic elements), and/or other circuitry. For example, in the embodiment shown in FIG. 7, decode block 608 is configured to provide decode signal S(3:0) where only one element of the four is logic high or "1" for a specific combination of inputs A and B.

NMOS 2-LUT 610 may be configured to receive decode signal S(3:0) and provide true "T" and complement "C" output signals corresponding to programming provided by registers/memory 870. As shown, in some embodiments, NMOS 2-LUT 610 may be implemented with four registers 870 coupled using complementary NMOS transistor structures 860 to gate coupled NMOS transistor structures 864 to selectively output true and complement output signals T and C. As noted herein, such structure for decode block 608 and/or NMOS 2-LUT 610 may be used to provide relatively high speed and low power operation of a corresponding logic cell, such as logic cell 600 of FIG. 6. Moreover, such logic cells configured to provide tap signal 419 as an output of a 3-LUT (e.g., including two 2-LUTs 410/(608 and 610) and a midlevel multiplexer 412, receiving a total of three logic cell inputs) may be configured to provide at least three logic cell inputs that are interchangeable, thereby increasing the flexibility of a constituent PLB and/or PLD to reduce overall usage of routing resources, as described herein.

In various embodiments of the present disclosure, it can be shown that 4-LUT 406 and logic cell 400 of FIG. 4 may be used to implement at least three times the number of three-input ripple arithmetic functions supported by alternative implementations of logic cell 400 with fewer interchangeable inputs, including all the three-input ripple arithmetic functions supported by the alternative implementations. Moreover, it can also be shown that 4-LUT 406 and logic cell 400 of FIG. 4 may be used to implement at least twenty five thousand four-input ripple arithmetic functions that cannot be implemented by alternative implementations of logic cell 400 with fewer interchangeable inputs.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

We claim:

1. A programmable logic device (PLD), comprising:
a plurality of programmable logic blocks (PLBs); and
a plurality of logic cells within at least one of the PLBs, each logic cell comprising a four input lookup table (4-LUT) configured to provide a 4-LUT output signal to associated carry logic and a generate circuitry configured to provide a generate signal to the associated carry logic, wherein:
each logic cell is configurable according to at least two selectable operational modes comprising a logic function output mode and a ripple arithmetic output mode;
at least three of the 4-LUT inputs for each logic cell are interchangeable while a design is one or more of synthesized, mapped, placed, and/or routed into the plurality of logic cells when a selected operational mode for each logic cell comprises the ripple arithmetic output mode;
the 4-LUT is configured to provide a tap signal to the generate circuitry; and
the associated carry logic is configured to receive the generate signal and the 4-LUT output signal and provide an output signal corresponding to the selected operational mode.

2. The PLD of claim 1, wherein:
the selected operational mode comprises the ripple arithmetic output mode; and
the associated carry logic is configured to receive a carry input signal, the generate signal, and/or the 4-LUT output signal and provide a function and/or sum output signal and a carry output signal.

3. The PLD of claim 1, wherein the 4-LUT comprises:
four substantially parallel 2-LUTs each configured to receive first and second input signals of the 4-LUT inputs;
two substantially parallel midlevel multiplexors each configured to receive a third input signal of the 4-LUT inputs and two 2-LUT output signals from the four 2-LUTS; and
an output multiplexor configured to receive a fourth input signal of the 4-LUT inputs and two multiplexed signals from the two midlevel multiplexors.

4. The PLD of claim 3, further comprising a level restoring stage disposed between the midlevel multiplexors and the output multiplexor, wherein:
the level restoring stage is configured to receive the multiplexed signals from the midlevel multiplexors and provide respective restored multiplexed signals to the output multiplexor; and
the 4-LUT is configured to provide the tap signal comprising one of the restored multiplexed signals to the generate circuitry of the logic cell that is configured to provide the generate signal to the associated carry logic.

5. The PLD of claim 1, wherein:
each logic cell comprises a ripple register coupled to the associated carry logic and a generate register coupled to the generate circuitry of the logic cell;
the selected operational mode is determined by values of the ripple register and the generate register; and
the at least one of the PLBs comprises between two and sixteen of the plurality of logic cells.

6. The PLD of claim 1, wherein:
the 4-LUT comprises a level restoring stage configured to provide the tap signal to the generate circuitry of the logic cell;
the level restoring stage comprises an inverter configured to provide the tap signal; and
the inverter comprises one or more low and/or ultra-low threshold voltage transistor structures as compared to a system voltage for the PLD.

7. The PLD of claim 6, wherein:
the level restoring stage comprises a feedback loop comprising the inverter and a P-type metal oxide semiconductor (PMOS) transistor structure;
an output of the inverter is coupled to a gate of the PMOS transistor structure; and
the source and drain of the PMOS transistor structure are coupled between the system voltage and an input of the inverter.

8. The PLD of claim 1, wherein:
the 4-LUT comprises a decode block configured to receive first and second input signals of the 4-LUT inputs and four substantially parallel N-type metal oxide semiconductor (NMOS) 2-LUTs;
the decode block is configured to provide a quaternary decode signal to the NMOS 2-LUTs; and
each NMOS 2-LUT is configured to provide differential 2-LUT output signals to a midlevel multiplexer of the 4-LUT.

9. The PLD of claim 8, further comprising a level restoring stage disposed between the midlevel multiplexor and an output multiplexor of the 4-LUT, wherein:
the level restoring stage comprises a cross coupled PMOS transistor arrangement and a feedback loop that are configured to convert differential multiplexed signals provided by the midlevel multiplexer to a single ended restored signal;
the cross coupled PMOS transistor arrangement comprises at least two PMOS transistor structures coupled across the differential multiplexed signals and a system voltage; and
the feedback loop comprises an inverter and one or more P-type metal oxide semiconductor (PMOS) transistor structures coupled between the system voltage and an input of the inverter.

10. A method for programming the PLD of claim 1, comprising:
generating configuration data to configure physical components of the PLD in accordance with a synthesized design comprising at least one ripple arithmetic operation that is implemented by at least one of the plurality of logic cells; and
programming the PLD with the configuration data.

11. A computer-implemented method comprising:
receiving a design identifying operations to be performed by a programmable logic device (PLD); and
synthesizing the design into a plurality of PLD components, wherein the synthesizing comprises:
detecting a ripple arithmetic operation in the design;
implementing the ripple arithmetic operation using at least one logic cell within a programmable logic block (PLB) of the PLD, each logic cell comprising a four input lookup table (4-LUT) configured to provide a 4-LUT output signal to associated carry logic and a generate circuitry configured to provide a generate signal to the associated carry logic, wherein:
each logic cell is configurable according to at least two selectable operational modes comprising a logic function output mode and a ripple arithmetic output mode;
at least three of the 4-LUT inputs for each logic cell are interchangeable while a design is one or more of synthesized, mapped, placed, and/or routed into the plurality of logic cells when a selected operational mode for each logic cell comprises the ripple arithmetic output mode, the 4-LUT is configured to provide a tap signal to the generate circuitry; and
the associated carry logic is configured to receive the generate signal and the 4-LUT output signal and provide an output signal corresponding to the selected operational mode.

12. The method of claim 11, further comprising:
placing the at least one logic cell in the PLD;
routing connections to the four inputs of the at least one logic cell, wherein the routing comprises:
interchanging two or more of the at least three interchangeable 4-LUT inputs of the at least one logic cell to reduce propagation delays, consumption of PLD resources, and/or consumption of routing resources, and
reprogramming the 4-LUT to transform the ripple arithmetic operation to account for the interchanged inputs.

13. The method of claim 11, wherein:
the selected operational mode comprises the ripple arithmetic output mode; and
the associated carry logic is configured to receive a carry input signal, the generate signal, and/or the 4-LUT output signal and provide a function and/or sum output signal and a carry output signal.

14. The method of claim 11, wherein the 4-LUT comprises:
four substantially parallel 2-LUTs each configured to receive first and second input signals of the 4-LUT inputs;
two substantially parallel midlevel multiplexors each configured to receive a third input signal of the 4-LUT inputs and two 2-LUT output signals from the four 2-LUTS; and
an output multiplexor configured to receive a fourth input signal of the 4-LUT inputs and two multiplexed signals from the two midlevel multiplexors.

15. The method of claim 14, further comprising a level restoring stage disposed between the midlevel multiplexors and the output multiplexor, wherein:
the level restoring stage is configured to receive the multiplexed signals from the midlevel multiplexors and provide respective restored multiplexed signals to the output multiplexor; and
the 4-LUT is configured to provide the tap signal comprising one of the restored multiplexed signals to the generate circuitry of the logic cell that is configured to provide the generate signal to the associated carry logic.

16. The method of claim 11, wherein:
the 4-LUT comprises a level restoring stage configured to provide the tap signal to the generate circuitry of the logic cell;
the level restoring stage comprises an inverter configured to provide the tap signal; and
the inverter comprises one or more low and/or ultra-low threshold voltage transistor structures as compared to a system voltage for the PLD.

17. The method of claim 11, wherein:
the 4-LUT comprises a decode block configured to receive first and second input signals of the 4-LUT inputs and four substantially parallel N-type metal oxide semiconductor (NMOS) 2-LUTs;
the decode block is configured to provide a quaternary decode signal to the NMOS 2-LUTs; and each NMOS 2-LUT is configured to provide differential 2-LUT output signals to a midlevel multiplexer of the 4-LUT.

18. A non-transitory machine-readable medium storing a plurality of machine-readable instructions which when executed by one or more processors of a computer system are adapted to cause the computer system to perform a computer-implemented method comprising:
routing connections to at least one logic cell of a programmable logic device (PLD), each cell comprising a four input lookup table (4-LUT) configured to provide a 4-LUT output signal to associated carry logic and a generate circuitry configured to provide a generate signal to the associated carry logic, wherein:
each logic cell is configurable according to at least two selectable operational modes comprising a logic function output mode and a ripple arithmetic output mode;
at least three of the 4-LUT inputs for each logic cell are interchangeable while a design is one or more of synthesized, mapped, placed, and/or routed into the plurality of logic cells when a selected operational mode for each logic cell comprises the ripple arithmetic output mode,
the 4-LUT is configured to provide a tap signal to the generate circuitry; and
the associated carry logic is configured to receive the generate signal and the 4-LUT output signal and provide an output signal corresponding to the selected operational mode.

* * * * *